United States Patent
Yoshinouchi et al.

[11] Patent Number: 5,937,304
[45] Date of Patent: *Aug. 10, 1999

[54] METHOD FOR FABRICATING SEMICONDUCTOR DEVICE AND METHOD FOR PRODUCING LIQUID CRYSTAL DISPLAY APPARATUS

[75] Inventors: Atsushi Yoshinouchi, Kashiba; Takeshi Hosoda, Kashihara; Tomohiko Yamamoto, Tenri, all of Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/665,978

[22] Filed: Jun. 19, 1996

[30] Foreign Application Priority Data

Jun. 23, 1995 [JP] Japan ................................. 7-158241

[51] Int. Cl.⁶ .................................................. H01L 21/26
[52] U.S. Cl. ......................... 438/308; 438/166; 438/487; 438/535; 438/795
[58] Field of Search .................................. 437/19, 21, 40, 437/41, 173, 174, 907, 908; 117/7, 8, 9, 10, 43, 904; 148/DIG. 90, DIG. 91, DIG. 92, DIG. 93; 438/166, 308, 487, 535, 795

[56] References Cited

U.S. PATENT DOCUMENTS

| | | | |
|---|---|---|---|
| 5,145,808 | 9/1992 | Sameshima et al. | 437/173 |
| 5,366,926 | 11/1994 | Mei at al. | 437/173 |
| 5,424,230 | 6/1995 | Wakai | 437/40 |
| 5,578,520 | 11/1996 | Zhang et al. | 437/174 |

FOREIGN PATENT DOCUMENTS

| | | | |
|---|---|---|---|
| 383230 A2 | 8/1990 | European Pat. Off. . | |
| 60-105216 | 6/1985 | Japan | 437/174 |
| 1-187814 | 7/1989 | Japan | 148/DIG. 90 |
| 2-295111 | 12/1990 | Japan . | |
| 3-24717 | 2/1991 | Japan | 117/904 |
| 4-286369 | 10/1992 | Japan . | |

OTHER PUBLICATIONS

S. Chen et al., Solid State Technol., 1(1996)113 "Polysilicon TFT technology will solve problems of mobility".

*Primary Examiner*—Charles Bowers
*Assistant Examiner*—Keith Christianson
*Attorney, Agent, or Firm*—Nixon & Vanderhye P.C.

[57] ABSTRACT

A method for fabricating a semiconductor device includes the steps of forming a semiconductor film containing silicon, implanting impurity elements to the semiconductor film, performing a dehydrogenation treatment to the semiconductor film, and activating the impurity elements in the dehydrogenated semiconductor film.

11 Claims, 10 Drawing Sheets

METHOD FOR FABRICATING SEMICONDUCTOR DEVICE AND METHOD FOR PRODUCING LIQUID CRYSTAL DISPLAY APPARATUS

BACKGROUND OF THE INVENTION

1. Field of the Invention

The present invention relates to a method for fabricating a semiconductor device suitably used in a liquid crystal display apparatus, a linear image sensor, a solar cell or the like. The present invention also relates to a method for producing a liquid-crystal display apparatus having such a semiconductor device.

2. Description of the Related Art

In recent years, it has been attempted in a liquid crystal display, an image sensor or the like to incorporate an external driver circuit for driving them on the same substrate of the LCD display or the image sensor. In order to lead such an attempt to success, there has been an increasing need for fabricating a semiconductor device such as a thin film transistor on a transparent insulating substrate. The following technique is one example of those techniques to meet the need: A thin film transistor (hereinafter, referred to as TFT) is fabricated by implanting impurity ions to a semiconductor layer with a gate electrode used as a mask to form n-type or p-type source/drain regions in self-alignment with the gate electrode. Such a technique has been developed because of the advantages associated with achieving a short transistor channel length and high performance.

However, in the aforementioned technique, when an inexpensive glass substrate is used as the substrate, it is necessary that the process be generally performed at 600° or less (preferably 500° C.). However, at such a low temperature, it is difficult to form satisfactory source/drain regions. For example, in the case where impurity ions are implanted to a polycrystalline silicon film, silicon atoms are knocked on and displaced from lattice sites by implanted ions, thereby generating lattice defects in the crystals.

Thus, in order to repair lattice damage and activate impurity ions, annealing for activation is required. Typical examples of annealing for activation include a furnace-annealing method, a lamp-annealing method, a laser-annealing method or the like. The furnace-annealing requires a long period of time, for example, 20 hours at 600° C. As a result, the glass substrate is adversely contracted by heat. In the lamp-annealing method, the wavelength of light generated by a lamp is relatively long, whereby the glass substrate is thermally affected, resulting in cracks, warpage or the like. Thus, these disadvantages make it difficult to practice the lamp-annealing method. On the other hand, in the lesser-annealing method, laser light of short wave-length i used so that only the surface of the semiconductor is heated to a high temperature. Thus, the glass substrate is subjected to substantially no adverse effect. Accordingly, the laser-annealing is suitably performed when a device is to be produced using a glass substrate. However, even in the laser-annealing method, it is difficult to form satisfactory source/drain regions, thus making it difficult to sufficiently prevent junction leakage at a drain edge portion during reverse bias.

FIG. 8 is a graph showing the relationship between a drain current $I_D$ and a gate voltage $V_G$ of a conventional n-type polycrystalline silicon thin film transistor. The conventional polycrystalline silicon thin film transistor is produced by implanting impurity ions to source/drain regions of a semiconductor layer in self-alignment with a gate electrode used as a mask, and then activating the impurity ions by the laser-annealing method. This relationship is obtained in the case where a transistor size is L (length)/ W (width)=8/8 μm. The curve indicated by a broken line shows the relationship where the voltage $V_{DS}$ between the source and the drain is 1 V. The curve indicated by a solid line shows the relationship where the voltage $V_{DS}$ between the source and the drain is 14 V. When $V_{DS}$ becomes larger ($V_{DS}$ is 14 V), the electric field generated at the drain edge becomes larger. As a result, leakage across the drain junction occurs via the crystal defects in the polycrystalline silicon film, and leakage current ($I_D$) become larger at the reverse bias ($V_0<0$).

As described above, such poor junction characteristics prevents a satisfactory switching device from being realized. For example, in order to fabricate a TFT in a pixel portion of an active matrix liquid crystal display, leakage current is preferably several pico-Amperes (pA) or less. Thus, the TFT characteristics shown in FIG. 8 are insufficient.

SUMMARY OF THE INVENTION

A method for fabricating a semiconductor device according to the invention includes the steps of forming a semiconductor film containing silicon, implanting impurity elements to the semiconductor film, performing a dehydrogenation treatment to the semiconductor film, and activating the impurity elements in the dehydrogenated semiconductor film.

In one embodiment of the invention, the dehydrogenation treatment reduces the amount of hydrogen in the semiconductor film containing silicon to $5\times10^{19}/cm^3$ or less.

In another embodiment of the invention, the activation is performed by laser irradiation, and the dehydrogenation treatment is performed by thermal treatment.

In still another embodiment of the invention, the dehydrogenation treatment is performed by thermal treatment at 300° C. to 500° C.

In yet another embodiment of the invention, the activation is performed by laser irradiation, and the dehydrogen treatment is also performed by laser irradiation.

In another embodiment of the invention, the laser irradiation for the dehydrogeation treatment is performed at a smaller energy density than laser irradiation for the activation.

According to another aspect of the invention, a method for producing a liquid crystal display apparatus includes the steps of fabricating the semiconductor device using the above-mentioned method for fabricating a semiconductor device.

Thus, the invention described herein makes possible the advantages of (1) providing a method for fabricating a semiconductor device having satisfactory junction characteristics by including a satisfactory impurity implanted portion, and (2) providing a method for producing a liquid crystal display apparatus having high display quality.

These and other advantages of the present invention will become apparent to those skilled in the art upon reading and understanding the following detailed description with reference to the accompanying figures.

DESCRIPTION OF THE PREFERRED EMBODIMENTS

Figure 1A:
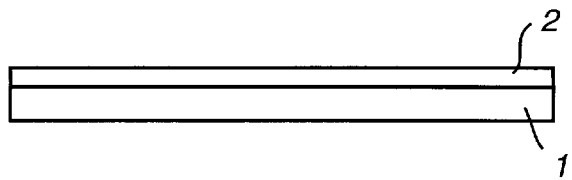
FIGS. 1A to 1M are cross sectional views illustrating a fabrication process sequence for a TFT of a first embodiment.

According to the method for fabricating the semiconductor device of the present invention, dehydrogenation treatment is performed before activating an impurity element implanted into the semiconductor film containing silicon. Thus, adverse effects due to the presence of hydrogen during impurity activation are eliminated, thus forming a satisfactory impurity implanted region. As a result, junction characteristic can be improved, and leakage current can be suppressed during reverse bias.

The activation of impurity elements in the silicon semiconductor means that an impurity atom is bonded to a substitution position in a silicon crystal lattice. At this time, hydrogen is an unnecessary element and preferably not present. It is believed that a hydrogen atom is so light that it easily moves, thus preventing activation. Therefore, in order to form a satisfactory impurity implanted region, after impurity elements are implanted to the semiconductor film, a dehydrogenation treatment is performed to remove unnecessary hydrogen, and then annealing for activation is importantly performed. In particular, it is important to reduce the amount of hydrogen in the semiconductor film containing silicon to $5 \times 10^{19} cm^3$ to less, and most preferably $5 \times 10^{18} / cm^3$ to less.

Furthermore, in the method for fabricating the semiconductor device of the present invention, it is particularly preferable to perform the activation by laser irradiation, and the dehydrogenation treatment be performed by thermal treatment. When a pulsed laser of short wavelength is used for the laser irradiation, the semiconductor film can be efficiently annealed without causing damage to the underlying substrate. For example, an excimer laser such as XeCl (wavelength: 308 nm), KrF (248 nm), or ArF (193 nm) can be used. Generally, however, when impurities are activated by laser irradiation, the temperature of the surface of the semiconductor film irradiated by laser light is raised to 600° C. or higher. In addition, the surface may melt in the case of a silicon semiconductor, and the temperature may be rapidly raised to 1000° C. or higher. Thus, in the case where annealing for activation during which the temperature is rapidly raised to a high temperature is to be performed, it is particularly important to perform the dehydrogenation. The dehydrogenation treatment can be performed by thermal treatment at 300° C. to 500° C., and most preferably by thermal treatment at 350° C to 450° C., and an annealing furnace enables the treatment to be relatively easily performed.

Furthermore, in the method for fabricating the semiconductor device of the present invention, it is particularly preferable to perform the annealing for activation by laser irradiation, and perform the dehydrogenation treatment by laser irradiation. The dehydrogenation treatment can be performed by laser irradiation at a smaller energy density than the laser irradiation for activation. Thus, annealing can be performed with substantially no occurrence of activation, and hydrogen can be removed. Accordingly, the dehydrogenation treatment can be easily performed using the same laser annealing apparatus that is to be used for activation before the activation.

In the method for producing a liquid crystal display apparatus of the present invention, by fabricating a semiconductor device excellent in switching characteristics of the pixel according to an embodiment of the method for fabricating the semiconductor device described above, a liquid crystal display apparatus with high display quality can be produced.

As described above, the present invention provides a method for fabricating a semiconductor device including a satisfactory impurity implanted region, and a method for producing a liquid crystal display apparatus with high display quality.

EXAMPLE 1

Hereinafter, an exemplary method for fabricating a semiconductor device according to the present invention will be described in detail with reference to the accompanying drawings.

FIGS. 1A to 1M are cross sectional views illustrating a fabrication process sequence of a TFT of a first embodiment. Reference numeral 1 in FIG. 1A denotes an insulating substrate. In the case where a glass substrate is used for the insulating substrate 1, in order to prevent adverse effects due to impurities contained in the substrate 1, the surface of the substrate 1 is preferably coated with a film formed of an insulating material such as $SiO_2$ and $SiN_x$. For example, the thickness of the coating film is 100 nm to 500 nm. An $SiO_2$ film obtained by using an $SiH_4$ and an $O_2$ gas at 430° C. by atmospheric CVD can be used as the coating film. An $SiO_2$ film formed by either method of sputtering, low-pressure CVD, plasma CVD, and remote plasma CVD to a thickness of 100 nm to 500 nm can be also used. Examples of a material for the coating film including $SiN_x$, $Al_2O_3$ and $Ta_2O_5$, or a material obtained in combination thereof.

As shown in FIG. 1A, an amorphous silicon semiconductor film 2 is deposited on the insulating substrate 1. The thickness of the amorphous silicon semiconductor film 2 is 30 nm to 150 nm. The amorphous silicon semiconductor film 2 can be formed by using an $SiH_4$ gas and an $H_2$ gas by plasma CVD with the substrate temperature of 200° C. to 300° C., or by low-pressure CVD with the substrate temperature of 400° C. to 570° C. As the semiconductor film 2, Si, SiGe or a silicon semiconductor doped with phosphorus or boron can be used. The semiconductor film is not limited to be an amorphous semiconductor film, but a microcrystalline or polycrystalline semiconductor film can be formed.

Figure 1B:
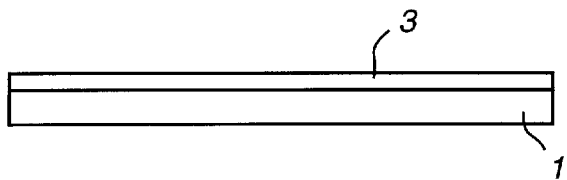

Then, as shown in FIG. 1B, the amorphous silicon semiconductor film 2 is subjected to annealing to be crystallized, thus forming a polycrystalline silicon semiconductor film 3. Examples of a method for annealing includes a furnace-annealing method, a laser-annealing method, a lamp-annealing method or the like. Annealing can be performed by one of the methods or methods in combination of two or more. For example, in the case of performing furnace-annealing to cause polycrystallization, the amorphous silicon semiconductor film 2 can be polycrystallized in an $N_2$ gas at 550° to 600° C. for 12 to 24 hours. When laser annealing is performed, especially if a pulsed laser of short wavelength is used, the semiconductor film can be efficiently annealed without causing damage to the underlying substrate. For example, an excimer laser such as XeCl (wavelength: 308 nm), KrF (248 nm), or ArF (193 nm) can be used. Generally, when the amorphous silicon semiconductor film 2 is annealed to form a polycrystalline silicon semiconductor film, the polycrystalline silicon semiconductor film has a larger grain diameter and better characteristics than a polycrystalline silicon semiconductor film which is directly formed without previously forming the amorphous silicon semiconductor film.

Figure 1C:
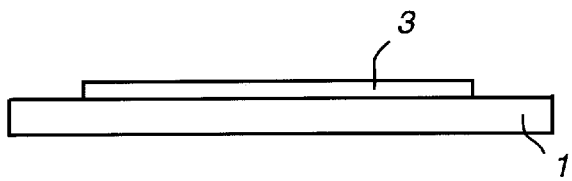

Then, as shown in FIG. 1C, the polycrystalline silicon semiconductor film 3 is patterned by etching to form an island shape.

Figure 1D:
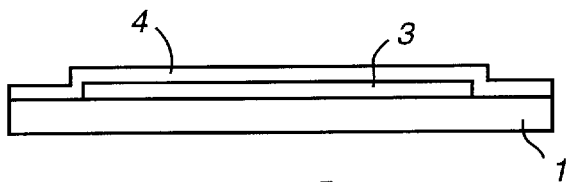

Thereafter, as shown in FIG. 1D, a gate insulating film 4 is formed to a thickness of 50 nm to 150 nm. For the gate insulating film 4, an $SiO_2$ film formed by using an $SiH_4$ gas and an $O_2$ gas by atmospheric CVD at 430° C. is used. Herein, the atmospheric CVD method is used to form the $SiO_2$ film, but any method among sputtering, low-pressure CVD, plasma CVD, and remote plasma CVD can be used to form an $SiO_2$ film to a thickness of 50 nm to 150 nm. An $SiO_2$ film formed by using a TEOS (Tetra-Ethyl-Ortho-Silicate, $Si(OC_2H_5)_4$) gas by atmospheric CVD or plasma CVD has satisfactory step coverage and can be used.

Then, in order to improve film quality of the gate insulating film, 4 annealing is performed at 600° C. in an $N_2$ gas for 12 hours. Although $SiO_2$ is used for the gate insulating film 4 in this example, $SiN_x$, $Al_2O_3$, $Ta_2O_5$ or a material in combination thereof can be used.

Figure 1E:
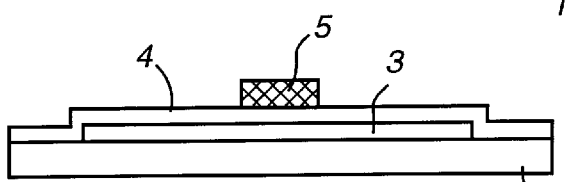

Then, as shown in FIG. 1E, a gate electrode 5 is formed to a thickness of 200 nm to 500 nm. The gate electrode 5 is formed by sputtering, using Ta or metal containing Al such as Al, AlSi, AlTi and AlSc as the material. In particular, aluminum alloys are preferable in that low-resistance electrode lines can be formed.

Figure 1F:
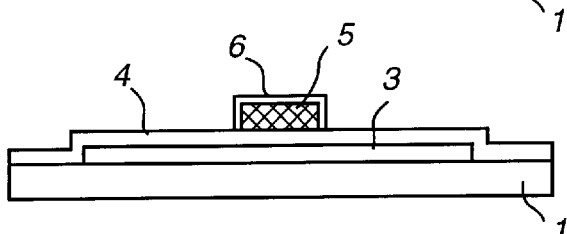

Next, as shown in FIG. 1F, the surface of the gate electrode 5 is anodized to form an anodic oxide film 6. The thickness of the anodic oxide film 6 is in the range of 50 nm to 1 $\mu$m.

Figure 1G:
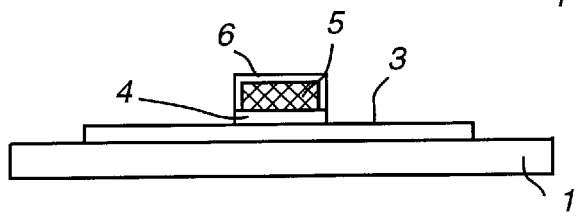

Then, as shown in FIG. 1G, the gate insulating film 4 is selectively etched by using the gate electrode 5 and the anodic oxide film 6 as a mask to expose portions for working as source/drain regions in the polycrystalline silicon semiconductor film 3. Etching can be wet etching using an etching solution or dry etching using plasma.

Figure 1H:
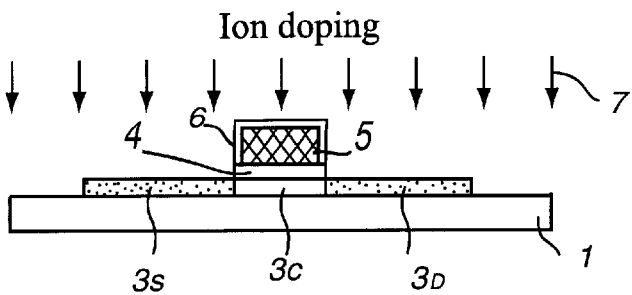
Figure 1I:
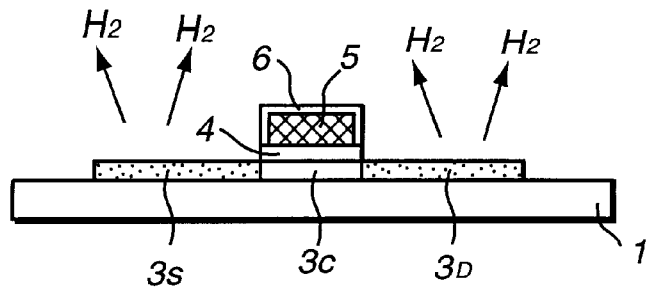
Figure 2:
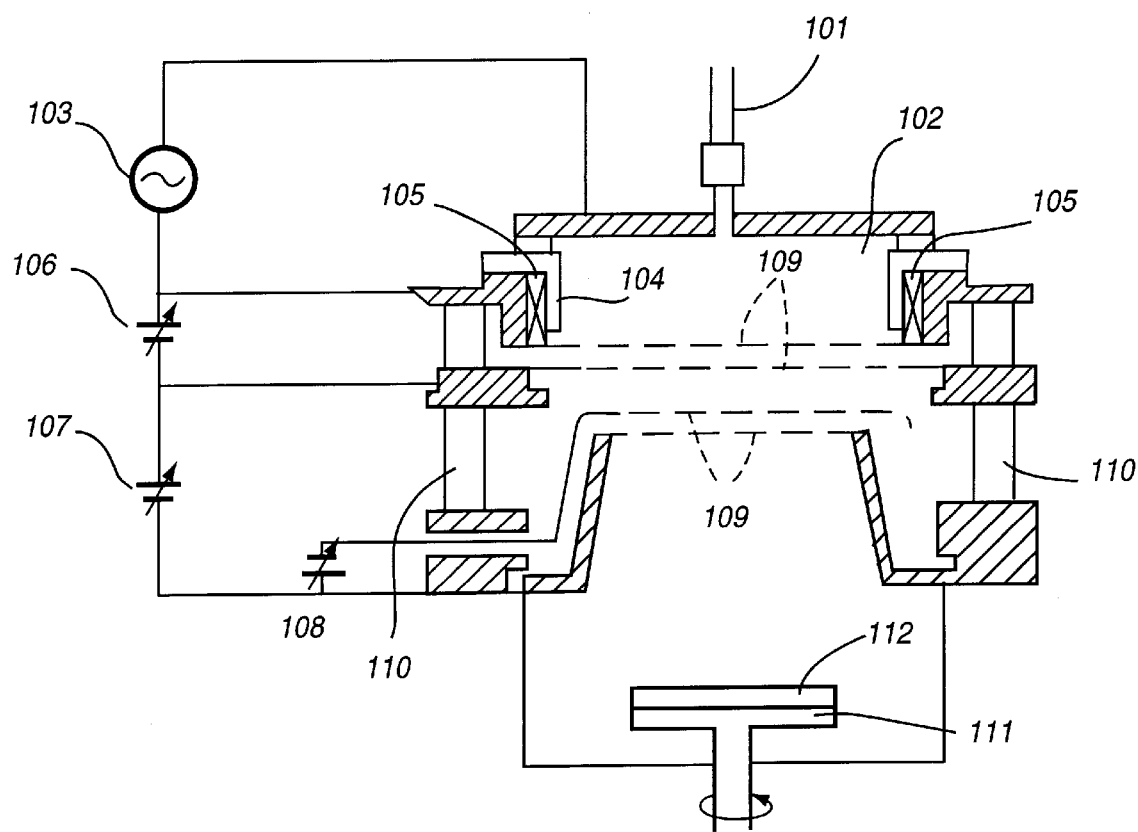
FIG. 2 is a schematic view illustrating an ion implantation apparatus for a large-area substrate.

Then, as shown in FIG. 1H, implantation of impurity ions 7 is performed. Phosphorus or arsenic ions are implanted in order to obtain an n-type TFT and boron ions are implanted in order to obtain a p-type TFT. In this manner, a source region $3_S$ and a drain region $3_D$ doped with impurity ions are formed. An ion implantation apparatus as shown in FIG. 2 can be used for a large-area substrate. The apparatus includes a gas introduction inlet 101, a chamber 102 for generating plasma, a high frequency power supply 103 for exciting the plasma, a high frequency electrode 104 for supplying a high frequency power to the plasma, and a magnetic member 105 for raising ionization efficiency and obtaining a better plasma shape. Such components produce the plasma (ion source). The ion accelerating section in the apparatus includes a power supply 105 for the first stage ion acceleration for extracting ions from the plasma, a power supply 107 for the second stage ion acceleration for further accelerating the ions, a suppressing power supply 108 for suppressing secondary electrons, porous electrode plates 109 and an insulator 110 for insulating each electrode plate. The apparatus also includes a substrate holder 111 for holding a substrate 112 to which ions are implanted. The substrate holder 111 has a rotating mechanism for improving uniformity of ion implantation. A source gas diluted with hydrogen such as a hydrogen diluted $PH_3$ and $B_2H_6$ is introduced from the gas introduction inlet 101, and high frequency power is applied to the high frequency electrode 104 to form plasma. After the ions from the plasma are accelerated between the accelerating electrode plates 109, the ions are implanted to the substrate 112 mounted on the substrate holder 111. By using such an apparatus, impurity ions (phosphorus or boron ions in this example) and hydrogen ions can be implanted. Instead of the plasma excited by the high frequency power, plasma produced by electron emission from a thermal filament or the like can be used.

Exemplary implantation conditions in the case where the ion implantation apparatus shown in FIG. 2 is used are as follows: a 5% hydrogen diluted $PH_3$ gas is introduced from the gas introduction inlet 101; high frequency power for plasma production is 100 W to 200 W; a total acceleration voltage of ions is 10 kV to 60 kV; Ion current density is 5 $\mu A/cm^2$ to 20 $\mu A/cm^2$; a total amount of ion implantation is $2 \times 10^{14} cm^2$ to $5 \times 10^{16} cm^2$. In the case where such an ion implantation apparatus is used, hydrogen ions are implanted simultaneously with impurity ions (donor or acceptor). Thus, hydrogen is implanted to the semiconductor film in a larger amount than the impurity ions. Under the above-mentioned conditions, the amount of hydrogen is as large as about $10^{19}/cm^3$ to $10^{21}/cm^3$. Accordingly, it is particularly important to reduce the amount of hydrogen by performing dehydrogenation thereafter.

Figure 8:
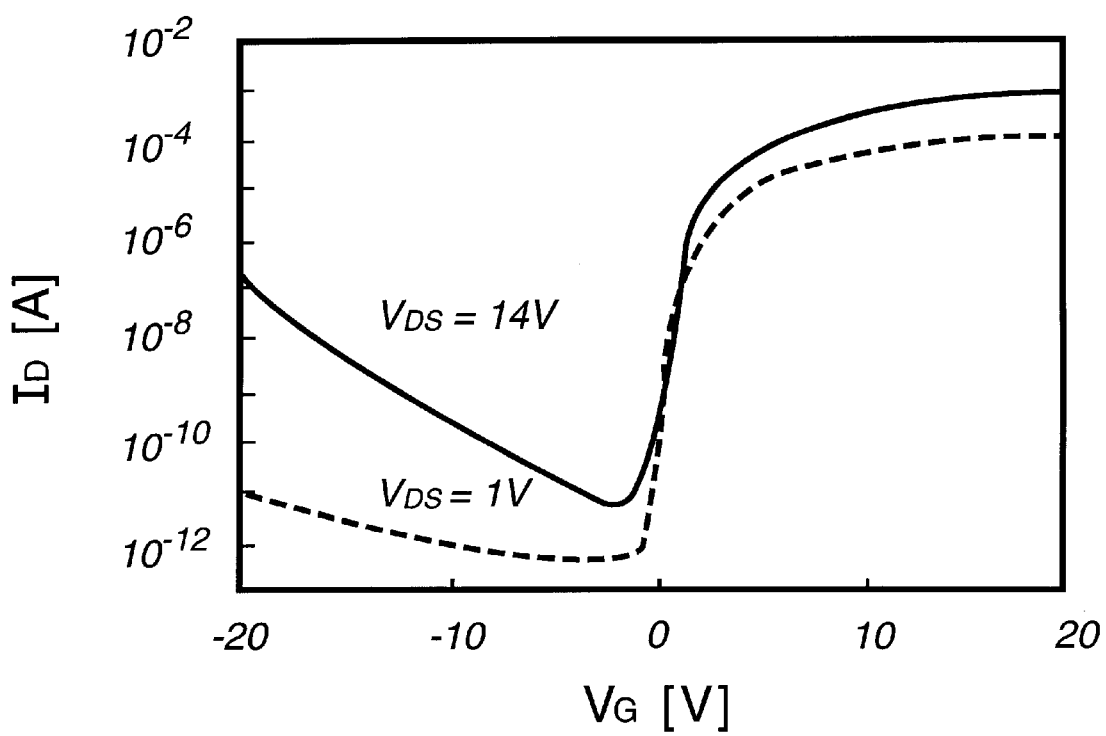
FIG. 8 is a graph showing the relationship between a drain current $I_D$ and a gate voltage $V_G$ of a transistor fabricated according to a conventional method.

Then, as shown in FIG. 11, dehydrogenation is performed. Thermal annealing is performed at 300° C. to 500° C. in a $N_2$ gas to dehydrogenate the polycrystalline silicon semiconductor film 3, the gate insulating film 4, the gate electrode 5 and the like. Hydrogen is removed at 300° C. or higher, but when the temperature is raised to 500° C. or higher, dehydrogenation occurs so rapidly that the device is adversely effected. For this reason, dehydrogenation is performed at 300° C. to 500° C. When the temperature is lower than 300° C., hydrogen is not sufficiently removed, and the dehydrogenation treatment requires a long period of time. Thus, dehydrogenation is preferably performed at 350° C. or higher. Since it is preferable to perform dehydrogenation without adversely affecting the device, dehydrogenation is preferably performed at 450° C. or lower. For example, dehydrogenation is performed at 400° C. for 1 hour in this example. Moreover, it is important to reduce the amount of hydrogen in the polycrystalline silicon semiconductor film 3 to $5 \times 10^{19}/cm^3$ or less, and most preferably $5 \times 10^{18}/cm^3$ or less, by performing the dehydrogenation treatment. From the relationship between the drain current $I_D$ and the gate voltage $V_G$ shown in FIG. 3, leakage current at the reverse bias (a drain current $I_D$ when $V_{DS}=14$ V, $V_0=-10$ V) and a remaining amount of hydrogen in the polycrystalline silicon semiconductor film are evaluated. The amount of hydrogen is evaluated by SIMS (Secondary Ion Mass Spectroscopy). As a result, when the amount of hydrogen in the polycrystalline silicon semiconductor film exceeds $5 \times 10^{19}/cm^3$, the characteristics thereof is substantially the same as the conventional characteristic shown in FIG. 8. On the other hand, when the amount of hydrogen is $5 \times 10^{19}/cm^3$ or less, the characteristics shown in FIG. 3 can be obtained in 95% of the transistors. However, in some transistors, leakage current is increased from the vicinity of $V_0=-10$. When the amount of hydrogen is $5\times10^{18}/cm^3$ or less, a transistor with the satisfactory characteristic of low leakage current of 3 pA or less can be obtained in all the evaluated transistors. When the amount of hydrogen in the semiconductor film is $5\times10^{19}/cm^3$ or less, no serious problems are caused as long as the reverse bias voltage is kept low, e.g., $V_C$ =about −5 V. Thus, it is necessary to reduce the amount of hydrogen to $5\times10^{19}/cm^3$ or less. Furthermore, when the amount of hydrogen is $5\times10^{18}/cm^3$ or less, the process margin becomes larger. Thus, a stable and satisfactory transistor can be produced. Therefore, the amount of hydrogen is preferably $5\times10^{18}/cm^3$ or less.

Furthermore, the dehydrogenation treatment can be performed by laser irradiation. For example, laser irradiation can be performed at a lower energy density than that for activating impurity ions implanted to the source/drain regions.

Figure 1J:
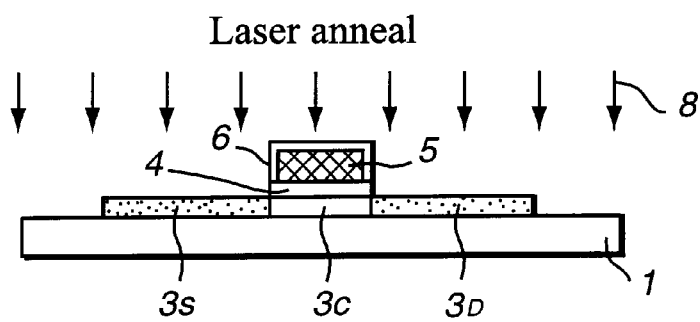

Then, as shown in FIG. 1J, laser irradiation 8 is performed for activating impurity ions implanted to the source/drain regions. In particular, when a pulsed laser of short wavelength is used, the semiconductor film can be efficiently annealed without causing damage to the underlying substrate. For example, an excimer laser such as XeCl (wavelength: 308 nm), KrF (wavelength: 248 nm), or ArF (wavelength: 193 nm) can be used. However, when impurities are activated by laser irradiation, the temperature of the surface of the semiconductor film irradiated by laser light is generally raised to 600° C. or higher. In addition, the surface may melt in the case of a silicon semiconductor, and the temperature may rapidly rise to 1000° C. or higher. At this point, if hydrogen is contained in the semiconductor film, the hydrogen is rapidly moved. In some cases, bumping of hydrogen occurs in the semiconductor film so that the crystallinity of the semiconductor is damaged. Thus, in the case where annealing for activation during which the temperature is rapidly raised to a high temperature is to be performed, it is important to perform the dehydrogenation prior to the activation annealing process. Although impurities are activated by laser irradiation in this example, activation can be performed by thermal treatment such as furnace-annealing.

Figure 1K:
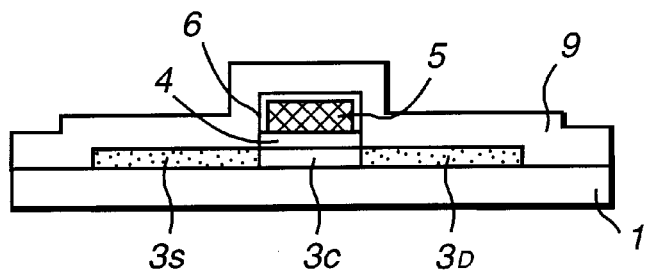

Then, as shown in FIG. 1K, an interlevel insulating film 9 is formed. In this example, the interlevel insulating film 9 is formed of $SiO_2$ by atmospheric CVD, $SiO_2$ by atmospheric CVD, or plasma CVD using a TEOS gas to a thickness 300 nm to 500 nm so as to have satisfactory step coverage. Alternatively, a silicon nitride film can be formed at 200° C. to 250° C. by plasma CVD as the interlevel insulating film 9.

Figure 1L:
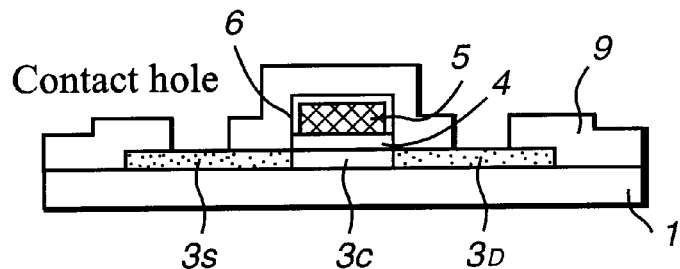
Figure 1M:
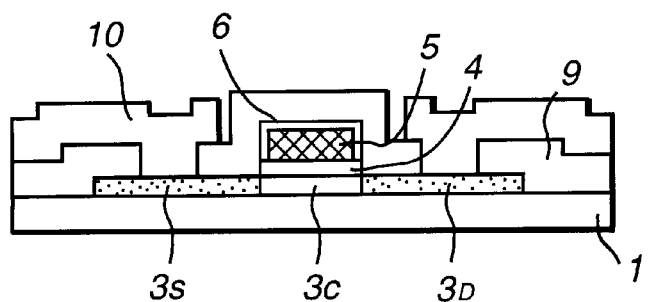

Then, as shown in FIG. 1L, contact holes are formed, and an interconnection 10 is formed by depositing a conductive film by sputtering, and by patterning the film, as shown in FIG. 1M. In this manner, a TFT is fabricated.

As described above, since the low-resistance source/drain regions can be fabricated by self-alignment with the gate electrode 5 used as the mask, degradation of the ON current due to parasitic resistors of the source/drain regions can be minimized. Furthermore, since the gate electrode 5 is coated with anodic oxide film 6 obtained by anodizing the gate electrode 5, silicide on the source/drain regions and the gate electrode 5 are prevented from being short-circuited. Moreover, for aluminum alloys, generally, projections called hillocks are generated to penetrate the interlevel insulating film during the annealing process or ion implantation process, thus causing short-circuiting with the upper lines or an increase in leakage current. However, when the gate electrode 5 is coated with anodic oxide film 6, the anodic oxide film 6 suppresses the hillocks from growing from Al. Thus, the generation of the hillocks (i.e., a problem when Al is used), can be suppressed. Accordingly, aluminum alloys with low resistance can be used for the gate electrode and bus lines. In the case where a liquid crystal display is produced, in order to reduce signal delay due to the CR time constant, it is preferable to use a low-resistance material to form gate electrodes and bus lines. Thus, it is significantly advantageous if aluminum alloys of low-resistance materials are used.

Figure 3:
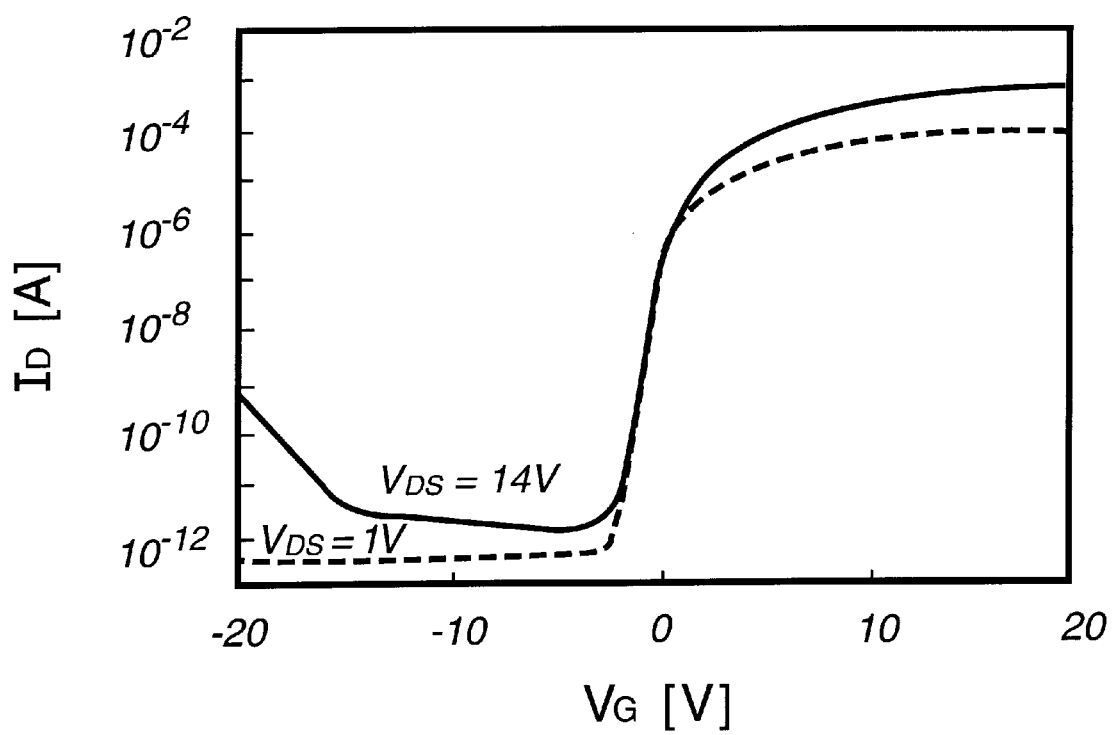
FIG. 3 is a graph showing the relationship between a drain current $I_D$ and a gate voltage $V_G$ of a transistor fabricated according to the first embodiment.

FIG. 3 shows the relationship between the drain current $I_D$ and the gate voltage $V_G$ of the thus fabricated n-type thin film transistor. FIG. 3 shows the curve characteristics in the case where the transistor size is L/W=8/8 μm, and the voltage $V_{DS}$ between the source and the drain is 1 V and the voltage $V_{DS}$ between the source and the drain is 14 V. When $V_{DS}$ becomes larger ($V_{DS}$ is 14 V), the electric field generated at the drain edge becomes larger. As a result, leakage across the drain junction occurs via the crystal defects in the polycrystalline silicon film, and leakage current ($I_D$) become larger at the reverse bias ($V_C$<0). However, when compared with the conventional characteristic shown in FIG. 8, the leakage current is significantly suppressed. This is because hydrogen is removed by the dehydrogenation treatment prior to activation so that rapid movement of hydrogen during activation is prevented. Thus, satisfactory source/drain regions can be formed, thus leading to satisfactory junction characteristics. Since the junction characteristics are satisfactory, a desirable switching device can be produced. Therefore, the TFT of the present invention can be used as a TFT for a pixel portion of an active matrix liquid crystal display.

EXAMPLE 2

Hereinafter, another exemplary method for fabricating a semiconductor device of the present invention will be described in detail with reference to the accompanying drawings.

FIGS. 4A to 4K are cross sectional views illustrating the fabrication process sequence of a TFT of a second embodiment. Reference numeral 11 in FIG. 4A denotes an insulating substrate. In the case where a glass substrate is used for the insulating substrate 11, in order to prevent adverse effects due to impurities contained in the substrate 11, the surface of the substrate 11 is preferably coated with a film formed of an insulating material such as $SiO_2$ and $SiN_x$. For example, the thickness of the coating film is 100 nm to 500 nm. An $SiO_2$ film obtained by using an $SiH_4$ and an $O_2$ gas at 430° C. by atmospheric CVD can be used as the coating film. An $SiO_2$ film formed by either method of sputtering, low-pressure CVD, plasma CVD, and remote plasma CVD to a thickness of 100 nm to 500 nm can be also used. Examples of a material for the coating film include $SiN_x$, $Al_2O_3$ and $Ta_2O_5$, or a material obtained in combination thereof.

Figure 4A:
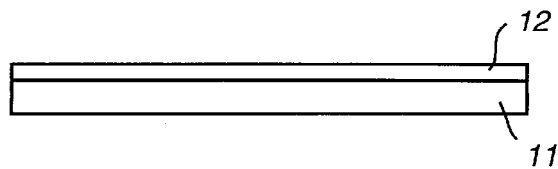
FIGS. 4A to 4K are cross sectional views illustrating a fabrication process sequence for a TFT of a second embodiment.

As shown in FIG. 4A, an amorphous silicon semiconductor film 12 is deposited on the insulating substrate 11. The thickness of the amorphous silicon semiconductor film 12 is 30 nm to 150 nm. The amorphous silicon semiconductor film 12 can be formed by using an $SiH_4$ gas and an $H_2$ gas by plasma CVD with the substrate temperature of 200° C. to 300° C., or by low-pressure CVD with the substrate temperature of 400° C. to 570° C. As the semiconductor film 12, Si, SiGe or a silicon semiconductor doped with phosphorus or boron can be used. The semiconductor film is not limited to be an amorphous semiconductor film, but a microcrystalline or polycrystalline semiconductor film can be formed.

Figure 4B:
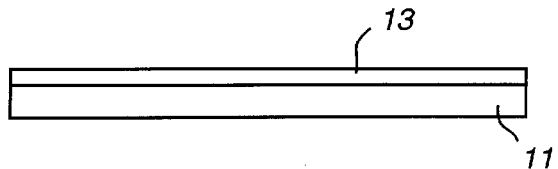

Then, as shown in FIG. 4B, the amorphous silicon semiconductor film 12 is subjected to annealing to be crystallized, thus forming a polycrystalline silicon semiconductor film 13. Examples of a method for annealing include a furnace-annealing method, a laser annealing method, a lamp annealing method or the like. Annealing can be performed by one of the methods or methods in combination of two or more. For example, in the case of performing furnace-annealing to cause polycrystallization, the amorphous silicon semiconductor film 12 can be polycrystallized in an $N_2$ gas at 550° to 600° C. for 12 to 24 hours. When laser annealing is performed, especially if a pulsed laser of short wavelength is used, the semiconductor film can be efficiently annealed without causing damage to the underlying substrate. For example, an excimer laser such as XeCl (wavelength: 308 nm), KrF (248 nm), or ArF (193 nm) can be used. Generally, when the amorphous silicon semiconductor film 12 is annealed to form a polycrystalline silicon semiconductor film, the polycrystalline silicon semiconductor film has a larger grain diameter and better characteristics than a polycrystalline silicon semiconductor film which is directly formed without previously forming the amorphous silicon semiconductor film.

Figure 4C:
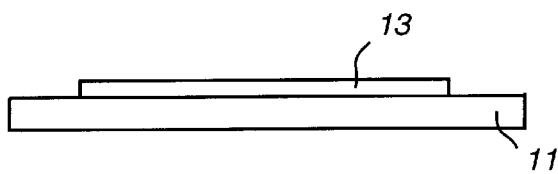

Then, as shown in FIG. 4C, the polycrystalline silicon semiconductor film 13 is patterned by etching to form an island shape.

Figure 4D:
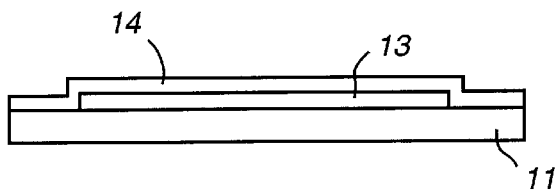

Thereafter, as shown in FIG. 4D, a gate insulating film 14 is formed to a thickness of 50 nm to 15 nm. For the gate insulating film 14, an $SiO_2$ film formed by using an $SiH_4$ gas and an $O_2$ gas by atmospheric CVD at 430° C. is used. Herein, the atmospheric CVD method is used to form the $SiO_2$ film, but any method among sputtering, low-pressure CVD, plasma CVD, and remote plasma CVD can be used to form an $SiO_2$ film with a thickness of 50 nm to 150 nm. An $SiO_2$ film formed by using a TEOS gas by atmospheric CVD or plasma CVD has satisfactory step coverage and can be used.

Then, in order to improve film quality of the gate insulating film 14, annealing is performed at 600° C. in an $N_2$ gas for 12 hours. Although $SiO_2$ is used for the gate insulating film 14 in this example, $SiN_x$, $Al_2O_3$, $Ta_2O_5$ or a material in combination thereof can be used.

Figure 4E:
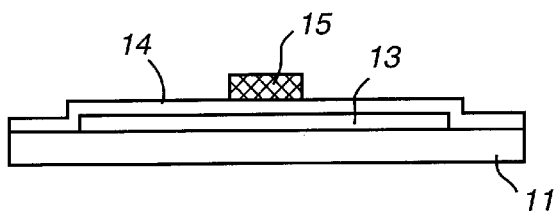

Then, as shown in FIG. 4E, a gate electrode 15 is formed to a thickness of 200 nm to 500 nm. The gate electrode 15 is formed of polycrystalline silicon film or an amorphous silicon film by low-pressure CVD, or an amorphous silicon film or microcrystalline silicon film by plasma CVD. Alternatively, the gate electrode 15 can be formed by using Ta or metal containing Al such as Al, AlSi, AlTi and AlSc as the material by sputtering. In particular, aluminum alloys are preferable in that low-resistance electrode lines can be formed.

Figure 4F:
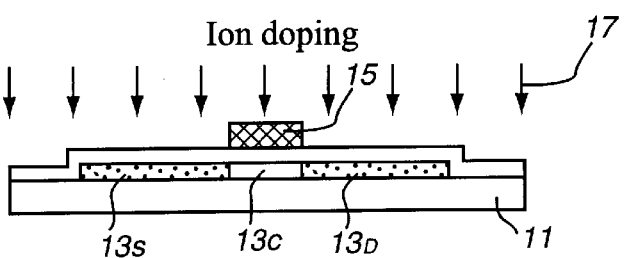

Then, as shown in FIG. 4F, implantation of impurity ions 17 is performed. Phosphorus or arsenic ions are implanted in order to obtain an n-type TFT and boron ions are implanted in order to obtain a p-type TFT. In this manner, a source region $13_S$ and a drain region $13_D$ doped with impurity ions are formed. An ion implantation apparatus as shown in FIG. 2 can be used for a large-area substrate.

Figure 4G:
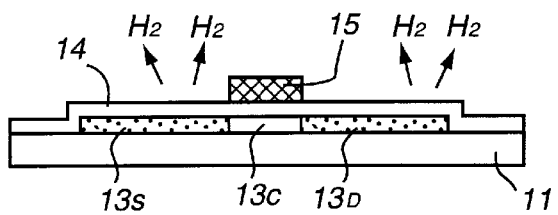

Then, as shown in FIG. 4G, dehydrogenation is performed. Thermal annealing is performed at 300° C. to 500° C. in a $N_2$ gas to dehydrogenate the polycrystalline silicon semiconductor film 13, the gate insulating film 14, the gate electrode 15 and the like. Hydrogen is removed at 300° C. or higher, but when the temperature is raised to 500° C. or higher, dehydrogenation occurs so rapidly that the device is adversely affected. For this reason, dehydrogenation is performed at 300° C. to 500° C. When the temperature is lower than 300° C., hydrogen is not sufficiently removed, and the dehydrogenation treatment requires a long period of time. Thus, dehydrogenation is preferably performed at 350° C. or higher. Since it is preferable to perform dehydrogenation without adversely affecting the device, dehydrogenation is preferably performed at 450° C. or lower. For example, dehydrogenation is performed at 400° C. for 1 hour in this example.

Furthermore, the dehydrogenation treatment can be performed by laser irradiation. For example, laser irradiation can be performed at a lower energy density than that for activating impurity ions implanted to the source/drain regions.

Figure 4H:
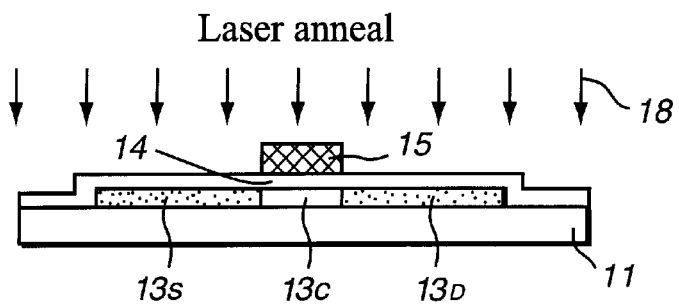

Then, as shown in FIG. 4H, laser irradiation 18 is performed for activating impurity ions implanted to the source/drain regions. In particular, when a pulsed laser of short wavelength is used, the semiconductor film can be efficiently annealed without causing damage to the underlying substrate. For example, an excimer laser such as XeCl (wavelength: 308 nm), KrF (wavelength: 248 nm), or ArF (wavelength: 193 nm) can be used.

Figure 4I:
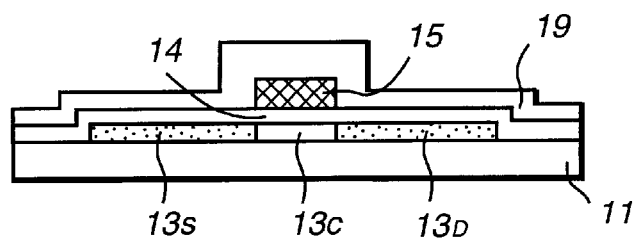
Figure 4J:
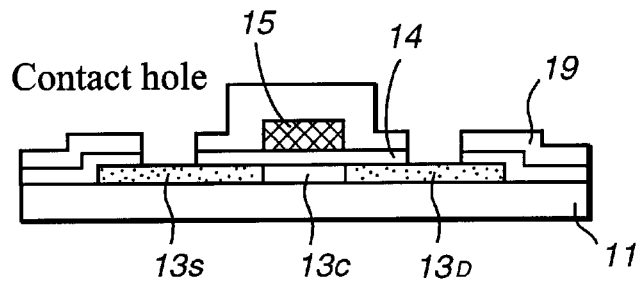
Figure 4K:
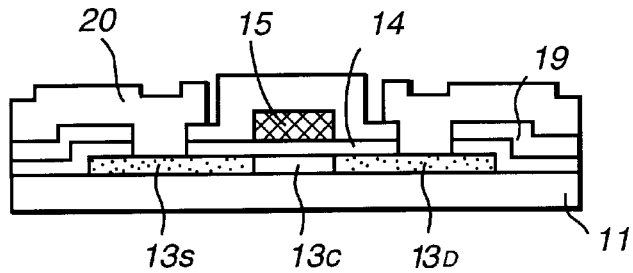

Then, as shown in FIG. 4I, an interlevel insulating film 19 is formed. In this example, the interlevel insulating film 19 is formed of $SiO_2$ by atmospheric CVD, or $SiO_2$ by atmospheric CVD or plasma CVD using a TEOS gas to a thickness of 300 nm to 500 nm so as to have satisfactory step coverage. Alternatively, a silicon nitride film can be formed at 200° C. to 250° C. by plasma CVD as the interlevel insulating film 19. Then, as shown in FIG. 4J, contact holes are formed, and an interconnection 20 is formed by depositing a conductive film by sputtering, and by patterning the film, as shown in FIG. 4K. In this manner, a TFT is fabricated.

As described above, since the low-resistance source/drain regions can be fabricated by self-alignment with the gate electrode 15 used as the mask, degradation of the ON current due to parasitic resistors of the source/drain regions can be minimized.

EXAMPLE 3

Hereinafter, a method for producing a liquid crystal display apparatus using the TFT of the present invention in the pixel portion will be described with reference to the accompanying drawings.

Figure 5:
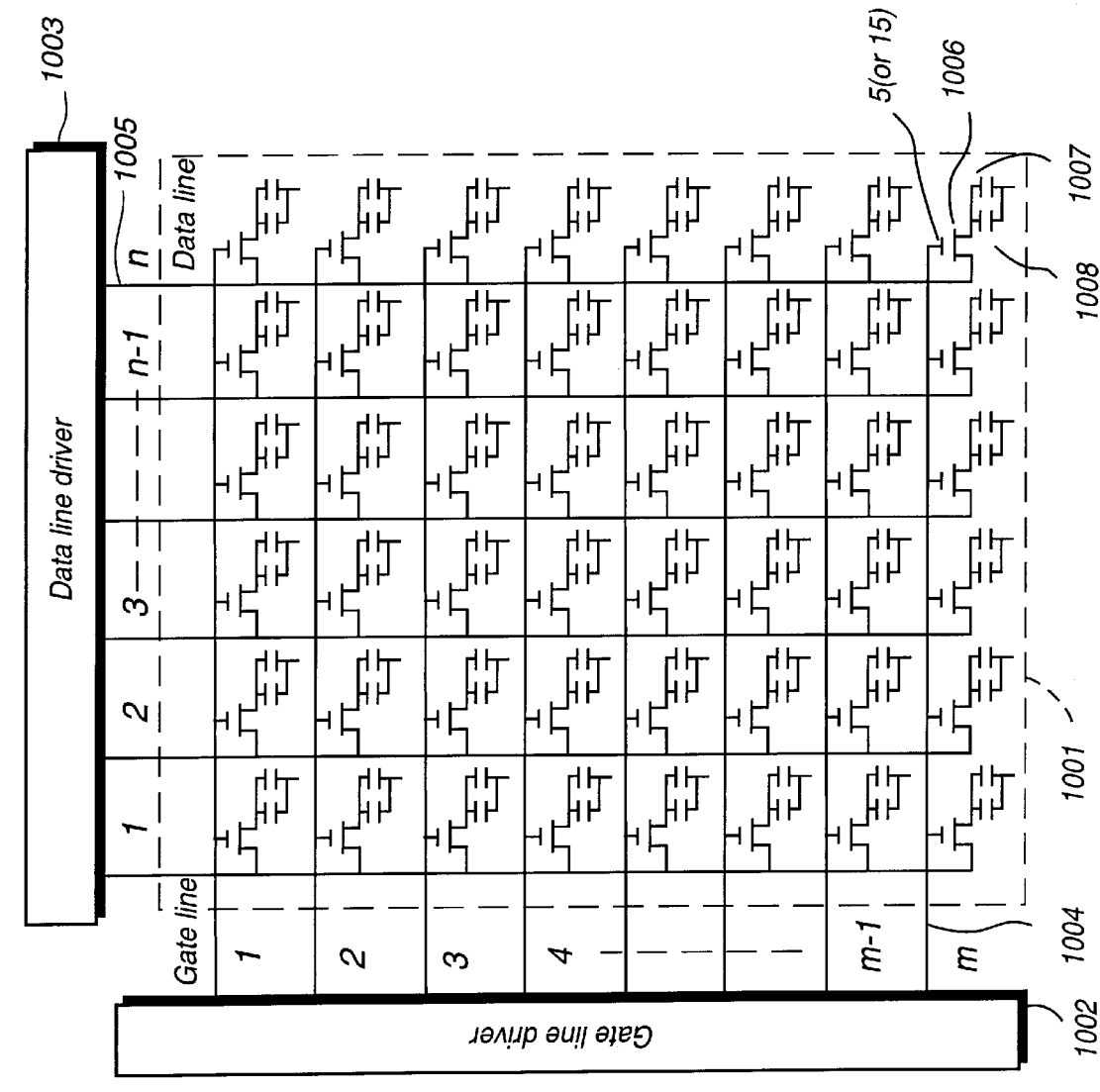
FIG. 5 is a view illustrating the structure of a liquid crystal display apparatus produced according to the method for producing a liquid crystal display apparatus of the present invention.
Figure 6:
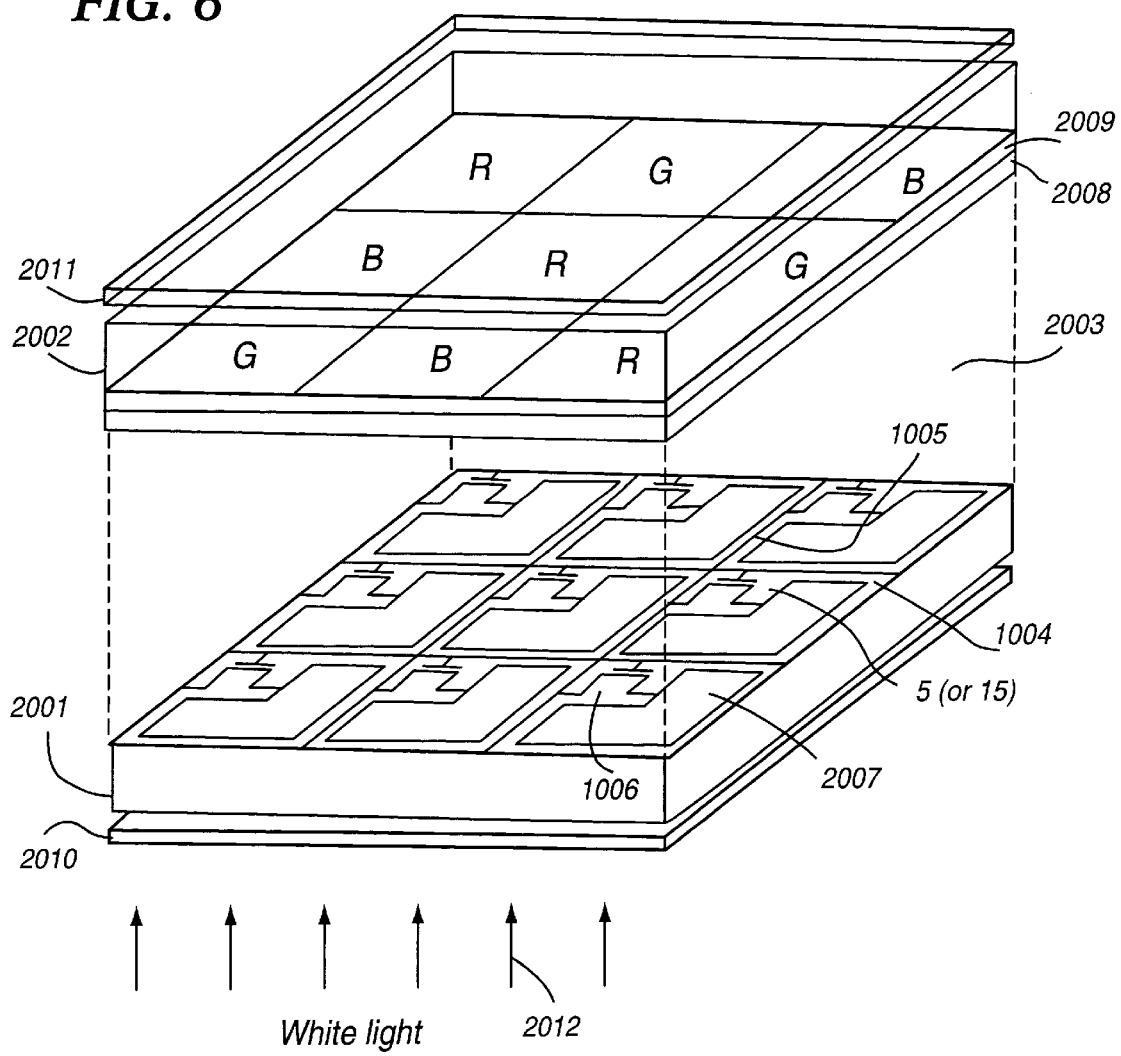
FIG. 6 is a perspective view illustrating a display section of the liquid crystal display apparatus of FIG. 5.
Figure 7:
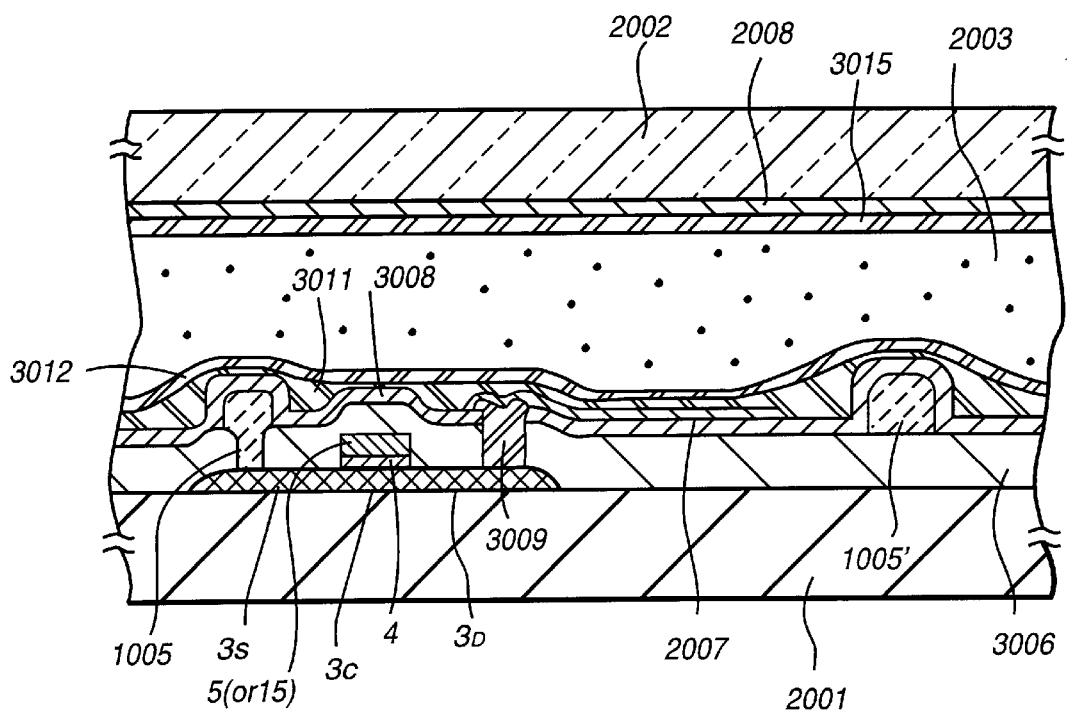
FIG. 7 is a cross sectional view illustrating a display section of the liquid crystal display apparatus of FIG. 5.

FIG. 5 is a diagram showing the structure of a liquid crystal display apparatus of this example. FIG. 6 is a perspective view of the display section. FIG. 7 is a cross sectional view of the display section. As shown in FIG. 5, in the liquid crystal display apparatus, gate lines (scanning lines) 1004 and data lines 1005 are formed on a display section 1001 so as to cross each other. TFTs 1006 are formed in the vicinity of the portions where the gate lines 1004 and the data lines 1005 cross each other so as to be in contact with a liquid crystal section 1007 and an auxiliary capacitor 1008. A gate line drive circuit 1002 and a data line drive circuit 1003 are formed in the periphery of the display section 1001. The gate line drive circuit 1002 and the data line drive circuit 1003 are connected to the TFTs 1006 via the gate lines 1004 and the data lines 1005, respectively.

As shown in FIGS. 6 and 7, the TFTs 1006, the scanning lines (gate lines) 1004, the data lines 1005 and pixel electrodes 2007 are formed on a substrate 2001. Gate electrodes of the TFTs 1006 are connected to the gate lines 1004, and source regions of the TFTs 1006 are connected to the data lines 1005. Drain regions of the TFTs 1006 are connected to pixel electrodes 2007 via a contact buffer metal layer 3009 (FIG. 7). The substrate 2001 further includes a liquid crystal alignment film 3012 thereon. The substrate 2001 is disposed opposite a counter substrate 2002 comprising common electrodes 2008, color filters 2009 and a second liquid crystal alignment film 3015. A liquid crystal layer 2003 is interposed between the substrate 2001 and 2002, forming a liquid crystal panel. Portions (liquid crystal section 1007 in FIG. 5) interposed between the pixel electrodes 2007 and the common electrodes 2008 constitute pixels.

Polarizing plates 2010 and 2011 are provided outside the liquid crystal panel. The substrate 2001 is irradiated with white light 2012 so that transmitted light is spacially modulated and forms an image. Each of the TFTs 1006 comprises a semiconductor layer including a source region $3_S$, a drain region $3_D$ and a channel region $3_C$, as shown in FIG. 7. A gate electrode 5 faces the channel region $3_C$ via a gate insulating film 4. An interlevel insulating film 3006 is formed over the TFTs, and the data line 1005 is formed thereon. The data line 1005 is connected to the source region $3_S$ through a contact hole provided in the interlevel insulating film 3006.

A second interlevel insulating film 3008 is formed over the data line 1005 and an auxiliary capacitor line 1005', and a contact buffer metal layer 3009 and a pixel electrode 2007 are provided on the second interlevel insulating film 3008. The pixel electrode 2007 is connected to the drain region $3_D$ through a contact hole provided in the second interlevel insulating film 3008 via the contact buffer metal layer 3009. A portion where the auxiliary capacitor line 1005', the second interlevel insulating film 3008 and the pixel electrode 2007 overlap forms an auxiliary capacitor 1008. Furthermore, a protective film 3011 and a liquid crystal alignment film 3012 are formed thereon.

As described in connection with Examples 1 and 2, since the source and drain regions $3_S$ and $3_D$ of the TFT 1006 have satisfactory junction characteristics, leakage current at the reverse bias can be reduced, thus obtained a liquid crystal display apparatus with high display quality.

As described above, according to the method for fabricating the semiconductor device of the present invention, a dehydrogenation treatment is performed before activating impurity elements implanted into the semiconductor film containing silicon. Thus, adverse effects due to the presence of hydrogen during impurity activation are eliminated, thus forming a satisfactory impurity implanted region. As a result, the junction characteristic can be improved, and leakage current can be suppressed during reverse bias. Furthermore, it is particularly preferable to perform activation by laser irradiation. Especially, when a pulsed laser of short wavelength is used, the semiconductor film can be efficiently annealed without causing damage to the underlying substrate.

Furthermore, in the method for fabricating the semiconductor device of the present invention, the dehydrogenation treatment is relatively easily performed by thermal treatment at 300° C. to 500° C., and most preferably by thermal treatment at 350° C. to 450° C.

Furthermore, in the method for fabricating the semiconductor device of the present invention, the dehydrogenation treatment can be performed by laser irradiation at a smaller energy density than the energy density of the laser irradiation when activation is caused. Thus, annealing can be performed with substantially no occurrence of activation, and hydrogen can be removed. Accordingly, the dehydrogenation treatment can be easily performed using the same laser annealing apparatus that is to be used for activation before the activation.

In the method for producing a liquid crystal display apparatus of the present invention, by using the semiconductor device having excellent switching characteristic produced according to the method for fabricating the semiconductor device in the pixel, a liquid crystal display apparatus with high display quality can be produced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor device comprising the steps of:

forming a crystalline semiconductor film containing silicon;

implanting impurity ions which are extracted from a plasma source to the crystalline semiconductor film;

performing a dehydrogenation treatment to the crystalline semiconductor film; and activating the impurity ions in the dehydrogenated semiconductor film, wherein the dehydrogenation treatment is performed by thermal treatment at 300° C. to 500° C.

2. A method for fabricating the semiconductor device according to claim 1, wherein the dehydrogenation treatment reduces the amount of hydrogen in the semiconductor film containing silicon to $5 \times 10^{19}/cm^3$ or less.

3. A method for fabricating the semiconductor device according to claim 2, wherein the activation is performed by laser irradiation, and the dehydrogenation treatment is performed by thermal treatment.

4. A method for fabricating a semiconductor device comprising the steps of:

forming a crystalline semiconductor film containing silicon;

implanting impurity ions which are extracted from a plasma source to the crystalline semiconductor film;

performing a dehydrogenation treatment to the crystalline semiconductor film; and activating the impurity ions in the dehydrogenated semiconductor film, wherein the activation is performed by laser irradiation, and the dehydrogenation treatment is also performed by laser irradiation.

5. A method for fabricating the semiconductor device according to claim 4, wherein the laser irradiation for the dehydrogenation treatment is performed at a smaller energy density than laser irradiation for the activation.

6. A method for producing a liquid crystal display apparatus comprising the steps of fabricating the semiconductor device using the method for fabricating a semiconductor device according to claim 1.

7. A method for producing a liquid crystal display apparatus comprising the steps of fabricating the semiconductor device using the method for fabricating a semiconductor device according to claim 2.

8. A method for producing a liquid crystal display apparatus comprising the steps of fabricating the semiconductor device using the method for fabricating a semiconductor device according to claim 3.

9. A method for producing a liquid crystal display apparatus comprising the steps of fabricating the semiconductor device using the method for fabricating a semiconductor device according to claim 4.

10. A method for producing a liquid crystal display apparatus comprising the steps of fabricating the semiconductor device using the method for fabricating a semiconductor device according to claim 5.

11. A method for fabricating a semiconductor device comprising the steps of:

forming a crystalline semiconductor film containing silicon;

implanting impurity ions which are extracted from a plasma source to the crystalline semiconductor film;

performing a dehydrogenation treatment to the crystalline semiconductor film; and activating the impurity ions in the dehydrogenated semiconductor film, wherein the dehydrogenation treatment is performed by thermal treatment at 350° C. to 450° C.

* * * * *